(12) United States Patent
Zverev et al.

(10) Patent No.: US 7,135,845 B2
(45) Date of Patent: Nov. 14, 2006

(54) DRIVE CIRCUIT FOR A SWITCH IN A SWITCHING CONVERTER AND METHOD FOR DRIVING A SWITCH IN A SWITCHING CONVERTER

(75) Inventors: Ilva Zverev, München (DE); Martin Feldtkeller, München (DE); Wolfgang Frank, Augsburg (DE); Michael Herfurth, Gilching (DE); Heng Chong Huang, Singapore (SG)

(73) Assignee: Infineon Technologies AG, Munich (DE)

( * ) Notice: Subject to any disclaimer, the term of this patent is extended or adjusted under 35 U.S.C. 154(b) by 289 days.

(21) Appl. No.: 10/766,299

(22) Filed: Jan. 28, 2004

(65) Prior Publication Data
US 2005/0013076 A1 Jan. 20, 2005

(30) Foreign Application Priority Data
Jan. 28, 2003 (DE) ................ 103 03 246

(51) Int. Cl.
*G05F 1/40* (2006.01)
*H02M 1/00* (2006.01)
*H02H 7/10* (2006.01)
(52) U.S. Cl. ................ 323/284; 323/288; 323/901; 363/49; 363/50
(58) Field of Classification Search ................ 323/222, 323/271, 272, 276, 277, 284, 285, 286, 288, 323/901, 908; 363/49, 50
See application file for complete search history.

(56) References Cited

U.S. PATENT DOCUMENTS 4,621,313 A * 11/1986 Kiteley ........................ 363/49

5,548,206 A * 8/1996 Soo ............................ 323/284
5,856,741 A * 1/1999 Hasegawa ................... 323/272

FOREIGN PATENT DOCUMENTS

DE 195 22 369 A1 1/1997

* cited by examiner

*Primary Examiner*—Jessica Han
(74) *Attorney, Agent, or Firm*—Maginot, Moore & Beck (57) ABSTRACT

The present invention relates to a drive circuit for a switch (T) connected to a rectifier arrangement in a switching converter which provides an output voltage (Vout) from an input voltage (Vin), the drive circuit having the following features:
a controller arrangement (40) having at least one control amplifier (OTA1) and a compensation network (41) having at least one capacitor (C4, C5), a signal dependent on the output voltage (Vout) being fed to said controller arrangement and the latter providing a control signal (S4),
a protection circuit (30), which is designed to detect at least one critical state of the switching converter and which provides a protection signal (S3) in a manner dependent on the presence of a critical state, the protection circuit (30) having a discharge circuit (32) coupled to the compensation network (41),
a signal generating circuit (20), to which the control signal (S4) and the protection signal (S3) are fed and which provides a drive signal (S5) having drive pulses according to the protection signal, the duty ratio of which drive signal is dependent on the control signal (S4).

21 Claims, 4 Drawing Sheets

DRIVE CIRCUIT FOR A SWITCH IN A SWITCHING CONVERTER AND METHOD FOR DRIVING A SWITCH IN A SWITCHING CONVERTER

FIELD OF THE INVENTION

The present invention relates to a drive circuit for a switch in a switching converter and to a method for driving a switch in a switching converter, in particular in a step-up converter which converts a mains AC voltage into a DC voltage. Step-up converters of this type for converting a mains voltage into a controlled DC voltage are also referred to as power factor controllers (PFC).

BACKGROUND

Figure 1:
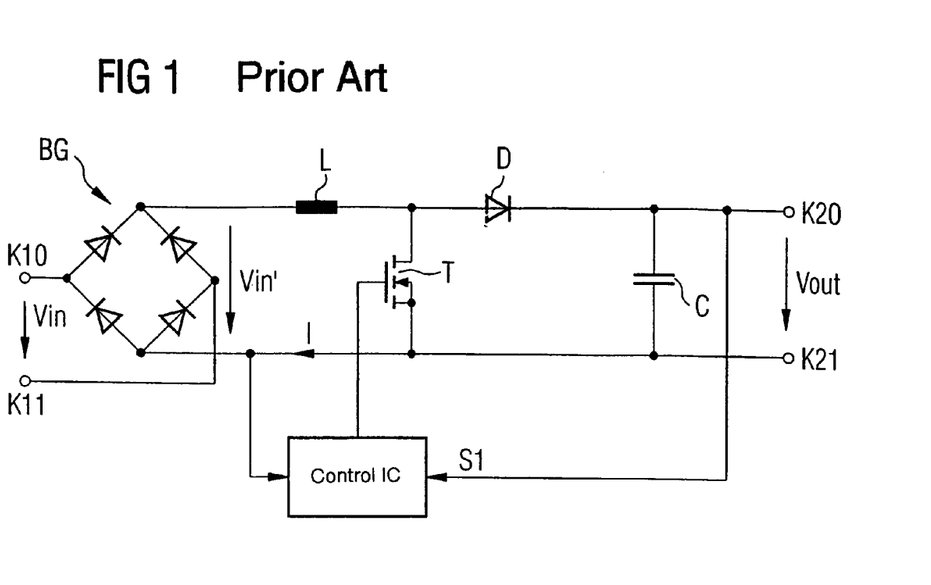
FIG. 1 shows a basic circuit diagram of a PFC designed as a step-up converter according to the prior art.

FIG. 1 shows a basic circuit diagram of such a PFC according to the prior art. The task of a PFC is to make available, from an input voltage Vin, a rectified, at least approximately load-independent output voltage Vout which serves for supplying a load, for example a DC-DC converter. The PFC comprises input terminals K10, K11, at which a mains AC voltage is present as input voltage Vin, the root-mean-square value of which may be between 90 V and 270 V in the case of a long-range power supply. The PFC comprises a bridge rectifier BG, and a further rectifier arrangement connected between the bridge rectifier BG and the output terminals K20, K21 and having a series circuit formed by a coil L and a diode D and a capacitor C connected between the output terminals K20, K21 and also having a semiconductor switch T, which is connected between a node that is common to the coil L and the diode D and the bridge rectifier BG and which serves to connect the coil in parallel with the output terminals of the bridge rectifier.

The semiconductor switch T is driven in clocked fashion by a drive IC which, via the semiconductor switch T, serves for controlling the power consumption of the PFC and thus for setting the output voltage Vout. For this purpose, a signal S1 dependent on the output voltage Vout is fed to the drive IC. During operation, the coil L stores energy when switch T is closed and outputs said energy via the diode D to the output capacitor C and a connected load when switch T is subsequently open. In this case, the power consumption is dependent on the duty ratio of the switch T, that is to say on the ratio of switch-on duration to drive period. In this case, the drive period is usually prescribed by an oscillator signal generated in the drive circuit.

The duty ratio of the switch T varies over the period of the usually sinusoidal input voltage, the frequency of which is significantly less than the switching frequency. This variation results from the fact that, in the case of a high instantaneous value of the input voltage, a shorter switch-on duration of the switch T suffices in order, per drive period for the maintenance of a required power consumption, to take up the same quantity of energy as in the case of a lower instantaneous value of the input voltage Vin. Overall, it holds true that as the root-mean-square value of the input voltage decreases, the duty ratio increases in order to achieve a given power consumption. The same holds true in the event of a rise in the power consumption of a load connected to the output terminals. In this case, too, the duty ratio of the switch increases in order to increase the power consumption overall for a given input voltage.

In the case of PFC with power consumptions above a legally prescribed limit value, there is the requirement for a mains current consumption which is proportional to the input voltage. For a control of this type, a signal dependent on the input current is also fed to the drive IC in accordance with FIG. 1. An example of a drive circuit for such a PFC is a module of the TDA 16888 type from Infineon Technologies AG, Munich.

During operation of a PFC, critical operating states may occur if, by way of example, the output voltage decreases to a value which lies outside the dimensioning limits of the switching converter. This is the case for example in the event of a mains failure or a so-called "brownout". "Brownout" denotes a disturbance in the supply mains in which the mains voltage falls, over a plurality of mains periods, below a limit specified for the power supply, said limit being 90 V, for example in the case of a long-range power supply.

The control of the PFC attempts to compensate for this decrease in the mains voltage by long switch-on periods of the switch T, in order to maintain a required power consumption. However, this can lead to impermissibly high currents in the switch T for which it is not designed. In order to avoid such high currents, PFCs with current limiting are known in which the switch T is switched off when its load current exceeds a maximum value. This has the effect that the switch T carries current only for in each case a short time, but the diode D carries current in each case for a correspondingly longer time, so that an impermissible heating of the diode D may result from this.

In order to avoid this problem, it is known to detect the root-mean-square value for the instantaneous value of the input voltage and to switch off the PFC if said root-mean-square value or the instantaneous value falls below a lower limit value. Such a PFC which detects the instantaneous value of the input voltage is disclosed for example in the data sheet UCC3817 from Unitrode Inc. What is disadvantageous in this case is that detecting the input voltage requires a voltage divider which divides the input voltage down to values which can be processed by a logic circuit. The components required for the voltage divider increase the costs and the circuitry outlay of such a PFC. Furthermore, detecting the root-mean-square value of the input voltage has the disadvantage that the input voltage has to be averaged over half a period of its temporal profile, which requires an integrator circuit having a large time constant, which can only be realized by means of external components. However, such external components considerably increase the costs and realization outlay of such a circuit.

It is an aim of the present invention to provide a drive circuit for a switch in a switching converter, in particular in a PFC, which ensures a protection of the switching converter in the case of critical operating states, in particular in the case of a decrease in the output voltage, and which does not require detection of the input voltage. Furthermore, an aim of the invention is a method for driving a switch in a switching converter, in particular in a PFC.

SUMMARY

This aim is achieved by a drive circuit in accordance with the present invention and a method in accordance with the present invention.

The invention's drive circuit for a switch connected to a rectifier arrangement in a switching converter which provides an output voltage from an input voltage comprises:

a first input terminal for feeding in an output voltage signal dependent on an output voltage of the switching converter, a controller arrangement having at least one control amplifier and a compensation network having at least one capacitor, the output voltage signal being fed to said controller arrangement and the latter providing a control signal, a protection circuit, which is designed to detect at least one critical state of the switching converter and which provides a protection signal in a manner dependent on the presence of a critical state, the protection circuit having a discharge circuit coupled to the compensation network, a signal generating circuit, to which the control signal and the protection signal are fed and which provides a drive signal having drive pulses according to the protection signal, the duty ratio of which drive signal is dependent on the control signal.

In the case of the switching converter according to the invention, the compensation network in the controller arrangement serves in a known manner for setting the control behavior of the overall arrangement, the at least one capacitor effecting an integrative portion of said control behavior. A control arrangement having a control amplifier and a compensation network can be gathered for example from the data sheet of the PFC module TDA4863 from Infineon Technologies AG. The charge stored in said at least one capacitor, or the voltage that can be tapped off across said capacitor, corresponds to an item of information about the average value of the previous profile of the output voltage and by way of that is indirectly related to the root-mean-square value of the input voltage, so that the control signal contains an item of information with regard to the root-mean-square value of the input voltage without the need for direct detection of the input voltage. The control amplifier forms a difference between the output voltage signal and a reference value and is coordinated with the compensation network for example in such a way that the control signal rises in order thereby to lengthen the switch-on durations of the switch if the output voltage decreases in order thus to increase the power consumption and to counteract a further decrease in the output voltage.

Besides an increased power consumption of the load, a decrease in the output voltage may also result from a decrease in the input voltage, both cases requiring an increase in the duty ratio of the switch in order, in the first case, to increase the power consumption and, in the second case, to maintain a required power consumption with a reduced input voltage.

The protection circuit serves for detecting at least one critical operating state, a first critical state being present for example when the output voltage has decreased below a lower limit value corresponding, for example, to 50% of the desired value of the output voltage. In the event of such a decrease in the output voltage, it is assumed that the input voltage has decreased below a given lower limit value, which, for the reasons mentioned above, justifies switching off the switching converter for protection against damage.

Switching off the switching converter owing to a great decrease in the output voltage is critical in the event of a reswitch-on for the following reason: if the output voltage decreases, then in the manner explained above, by means of the control signal at the output of the controller arrangement, the duty ratio of the switch is firstly increased by means of the signal generating circuit in order to increase the power consumption or to keep the power consumption constant in the event of a decreasing output voltage. Said control signal is preserved even after the switch-off owing to the integrating capacitor of the compensation network, which, in the event of the switching converter being switched on again, may lead to damage when the input voltage is significantly greater after the reswitch-on than before the switch-off but the control signal initially effects a driving of the switch as in the case of an input voltage that is small before the switch-off. If no current limiting is present, the initially long switch-on durations then lead to high input currents. If current limiting is present, then after said reswitch-on, as explained in the introduction in connection with FIG. 1, the result is short switch-on durations of the semiconductor switch and long time durations during which the diode conducts current, which results in the diode being greatly heated. In order to avoid such problems in the event of the reswitch-on, the protection circuit comprises the discharge circuit for the compensation network, said discharge circuit being designed to discharge the compensation network on detection of critical state which leads to a switch-off of the switching converter. Preferably, the discharge circuit comprises a switch, which is connected between the compensation network and a reference-ground potential and which is driven in a manner dependent on a detection of a critical state by a control circuit.

Preferably, the discharge circuit detects the discharge state of the compensation network and generates a discharge signal dependent on the discharge state, a reswitch-on of the switching converter after a switch-off preferably being permitted again only when the compensation circuit has reached a predetermined discharge state. This is preferably achieved by virtue of the fact that the protection signal is generated in a manner dependent on the discharge signal and the switching converter remains switched off as long as the protection signal has a predetermined level.

In one embodiment, the discharge circuit has a current measuring arrangement for detecting a discharge current of the compensation network and generates the discharge signal in a manner dependent on an amplitude of the discharge current, for example by the discharge current being compared with a reference current.

In order to enable the switching converter to start up, the protection circuit is preferably designed to detect the first critical state, in which the output voltage has decreased below a lower limit, only when the output voltage has previously exceeded an upper limit which indicates occasional normal operation.

Besides the first critical state, the protection circuit may be designed to detect further critical states and to switch off the switching converter by means of the protection signal.

Thus, the protection circuit detects a second critical state for example when the output voltage, independently of the previous value therefore, lies below a limit value which is significantly less than the desired value of the output voltage and which indicates an interruption of the feedback loop which feeds the output voltage signal back to the drive circuit.

A further critical state may be detected when an internal supply voltage of the drive circuit decreases below a value in the case of which a sufficient supply of the components of the drive circuit is not ensured.

One embodiment of the drive circuit according to the invention provides for the discharge circuit to be driven to discharge the compensation network upon detection of each of the critical states, while another embodiment provides for the compensation network to be driven only upon detection of one or more selected critical states and, in the case of the remaining critical states, only to switch off the switching converter without discharging the compensation network. The selected critical state in which the compensation network is discharged is, in particular, the state in which the output voltage decreases below the lower limit, since the abovementioned problems would otherwise occur during reswitch-on.

A switch-off of the switching converter upon detection of a critical state is preferably effected by the interruption of a driving of the switch by the signal generating circuit according to the protection signal.

The signal generating circuit may be a conventional signal generating circuit which provides a clocked drive signal for the switch in a manner dependent on an output-voltage-dependent control signal and a protection signal. In the case of a drive circuit for a PFC, a signal dependent on an input current may additionally be fed to said signal generating circuit in order to achieve a current consumption proportional to the input voltage. The signal generating circuit may additionally have protection mechanisms for protecting the circuit against an excessively high input current or for limiting the input current.

The invention additionally relates to a method for driving a switch connected to a rectifier arrangement in a switching converter. This method comprises the provision of an output voltage signal dependent on an output voltage of the switching converter, the generation of a control signal from the output voltage signal by means of a control arrangement having a control amplifier and a compensation network having at least one capacitor, the provision of a drive signal having a sequence of drive pulses for the switch, the monitoring of at least one critical switching state of the switching converter, the interruption of the generation of drive pulses if a critical switching state is detected and at least partial discharge of the at least one capacitor of the compensation network.

In one embodiment, it is provided that a discharge current of the compensation network is detected and the compensation network is discharged until the discharge current has fallen below a predetermined threshold.

In one embodiment of the method, a first critical state is detected if the output voltage signal lies below a first threshold value, and is preferably detected only when the output voltage signal falls below the first threshold after the output voltage signal had previously exceeded a larger second threshold.

Preferably, a second critical state is detected if the output voltage signal falls below a third threshold, which is less than the first threshold. This state occurs for example in the event of an interruption in the feedback loop which feeds the output voltage back to the drive circuit.

In a further embodiment, a third critical state is detected if a supply potential of the drive circuit falls below a predetermined fourth threshold.

The present invention is explained in more detail below with reference to exemplary embodiments in the figures, in which

BRIEF DESCRIPTION OF THE DRAWINGS

In the figures, unless specified otherwise, identical reference symbols designate identical parts with the same meaning.

DETAIL DESCRIPTION

Figure 2:
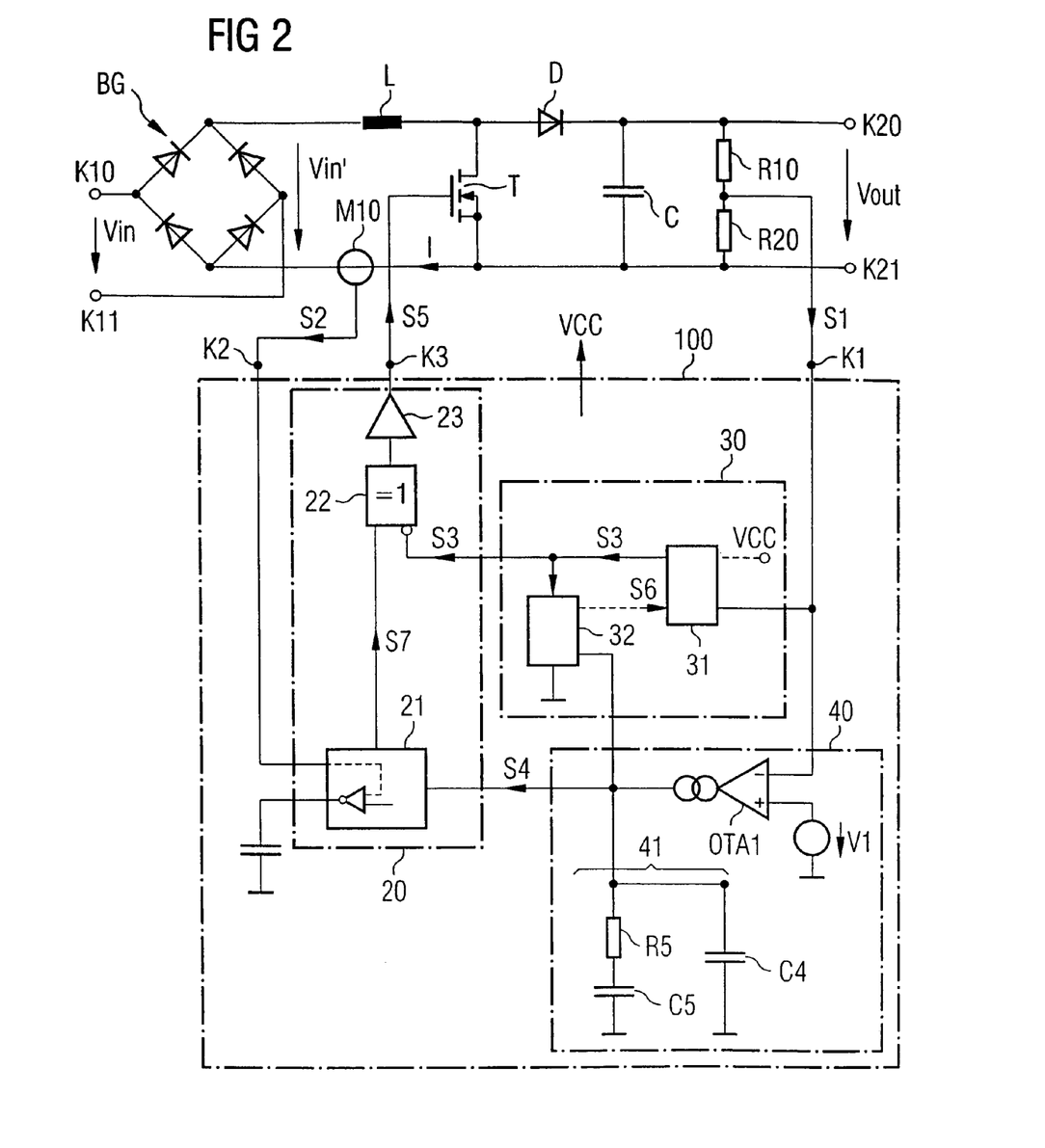
FIG. 2 shows a switching converter designed as a step-up converter with a drive circuit according to the invention for a semiconductor switch in the switching converter, the drive circuit having a controller arrangement, a signal generating circuit and a protection circuit.

In order to illustrate the construction and the functioning of a drive circuit according to the invention, FIG. 2 shows a switching converter designed as a step-up converter, the circuit topology of which corresponds to that of the switching converter already explained with reference to FIG. 1, with a drive circuit 100 according to the invention for a switch T designed as a MOSFET, which, in the case of the step-up converter, is connected in series with the coil L between the input terminals K10, K11 or between the output terminals of the bridge rectifier BG connected between the input terminals K10, K11. The task of the drive circuit 100 is to drive the switch T in such a way that an at least approximately load-independent output voltage Vout is made available from an input voltage Vin which is present at the input and whose root-mean-square value may be subject to fluctuations.

The drive circuit 100 has a first input terminal K1, to which is fed an output voltage signal S1 dependent on the output voltage Vout, which signal is generated from the output voltage Vout by means of a voltage divider R10, R20 connected between the output terminals K20, K21. Said output voltage signal S1 is fed to a controller arrangement 40 having a control amplifier OTA1 and a compensation network 41, the controller arrangement 40 providing, from the output voltage signal S1, a control signal S4 dependent on the output voltage, which control signal is fed to a drive signal generating circuit 20, which provides, at a connecting terminal K3 of the drive circuit 100, a drive signal S5 for the switch T in the switching converter. An input current signal S2 dependent on an input current I of the switching converter is fed to the drive signal generating circuit 20 via a further input terminal K2, said input current signal being generated by means of a current measuring arrangement M10 connected into the load circuit of the converter.

The drive signal generating circuit 20 comprises a pulse width modulator 21, to which the control signal S4 and the input current signal S2 are fed and which provides a pulse-width-modulated signal S7, the duty ratio of which is dependent on the control signal S4 and the input current signal S2. The pulse width modulator 21 may be a conventional pulse width modulator for use in switching converters which is designed to make available, from an output-voltage-dependent control signal S4 and an input current signal S2, a pulse-width-modulated signal for the driving of a switch T in a PFC, the pulse width modulator 21 generating the pulse-width-modulated signal preferably in such a way that the input current I of the switching converter is proportional to the voltage Vin' present at the output of the bridge rectifier BG.

In the exemplary embodiment, the control amplifier OTA1 of the controller arrangement 50 is designed as a transconductance amplifier which supplies an output current dependent on the difference between a reference signal V1 present at the input and the output voltage signal S1, the reference signal V1 multiplied by the value by which the voltage divider divides the output value Vout representing the desired value of the output voltage Vout.

The compensation network 41, which, in the exemplary embodiment, comprises a parallel circuit formed by a capacitor C4 and a series circuit having a resistor R5 and a capacitor C5, is connected between the output of the control amplifier OTA1 and reference-ground potential GND, to which the input and output voltages Vin, Vout and the rest of the signals are referred. In the exemplary embodiment, the control signal S4 is the voltage across said compensation network 41 with respect to reference-ground potential. If the output voltage signal S1 is less than the reference signal V1 in the drive circuit illustrated, then the capacitors C4, C5 are charged further by means of the output current of the operational amplifier OTA1 and the control signal S4 rises, in which case, by means of the drive signal generating circuit 20, with the control signal S4 rising, the switch-on durations of the semiconductor switch T are lengthened in order to increase the power consumption of the switching converter and thus to counteract a further decrease in the output voltage Vout. If the output voltage signal S1 exceeds the reference signal V1, then the capacitors C4, C5 are discharged via the operational amplifier OTA1, as a result of which the control signal S4 becomes smaller and the switch-on durations of the semiconductor switch T are reduced overall. As already explained, the switch-on durations, in the case of a sinusoidal input signal Vin, vary over the period of the input signal in order that the energy taken up per drive period of the switch T is kept constant, since a shorter switch-on duration is necessary in the case of a large instantaneous value of the input voltage Vin than in the case of a smaller instantaneous value of the input voltage Vin, in order to take up the same energy per switch-on period and thus to keep the power consumption approximately constant.

The drive circuit 100 furthermore comprises a protection circuit 30, which is designed to detect critical operating states of the switching converter and which generates a protection signal S3, which, depending on its level, prevents a driving of the semiconductor switch T and thereby switches off the switching converter.

In the exemplary embodiment, the pulse-width-modulated signal S7 generated by the pulse width modulator 21 and the protection signal S3 are fed to an AND element 22, downstream of whose output a driver circuit 23 is connected, at whose output the drive signal S5 is present. In this embodiment, a drive signal S5 having drive pulses is generated only when the protection signal S3 fed to an inverting input of the AND element 22 has a low level. In this case, the pulse-width-modulated signal S6 is available unchanged at the output of the AND element 22. If the protection signal S3 has a high level, then the driving of the semiconductor switch T is interrupted and the switch remains permanently open. In the exemplary embodiment, the switching converter is switched off by means of the protection signal S3, which serves as an enable signal for the drive signal generating circuit 20, and which enables the drive signal generating circuit 20 in a manner dependent on said level for generating a drive signal S5 having drive pulses.

It goes without saying that any desired further circuitry realizations are conceivable in order to switch off the switching converter according to the protection signal S3.

The protection circuit 30 comprises a detection circuit 31, which serves to detect critical operating states of the switching converter and which provides the protection signal S3, and also a discharge circuit 32, which is driven by the protection signal S3 and is connected to the compensation network 41 and, in the example, is designed to discharge the compensation network 41 according to the protection signal S3. The discharge of the compensation network upon detection of a critical operating state which leads to the switching converter being switched off by means of the protection signal S3 prevents the situation in which, in the event of a renewed reswitch-on after a noncritical operating state has been reached, a control signal S4 is present at the drive signal generating circuit 20, which control signal effects long switch-on durations of the semiconductor switch T which, in the event of a large input voltage Vin, might lead to damage to the switching converter. This would be the case in particular if, due to mains disturbances before the switch-off, the output voltage Vout decreased and the control signal S4 increased to high values in order to counteract a decrease in the output voltage Vout. Without the discharge circuit 32, this large control signal would still be present at the drive signal generating circuit 20 after the reswitch-on and initially bring about long switch-on durations, even if, in the meantime, the mains disturbances are no longer present and the input voltage Vin again assumes values which lie within the dimensioning range of the switching converter. If a current limiting function is realized, which limits the input current to a maximum value, then in the fault case explained, after the reswitch-on, the current limiting would be reached after a few "long" switch-on durations, this subsequently resulting in very short switch-on durations of the semiconductor switch and correspondingly long switch-on durations of the diode, which would damage the diode in the case of a full load current.

The discharge circuit 32 is preferably designed to detect the discharge state of the compensation network and to supply a discharge signal S6 back to the detection circuit 31, the detection circuit 31 generating the protection signal S3 in a manner dependent on said discharge signal S6 in order to enable the switching converter to be switched on again only when the compensation network 41 has reached a predetermined discharge state indicated by the discharge signal S6.

The drive circuit is preferably integrated in a chip, in which case the compensation network 41 may be realized partly or completely with discrete components outside the chip.

Figure 3:
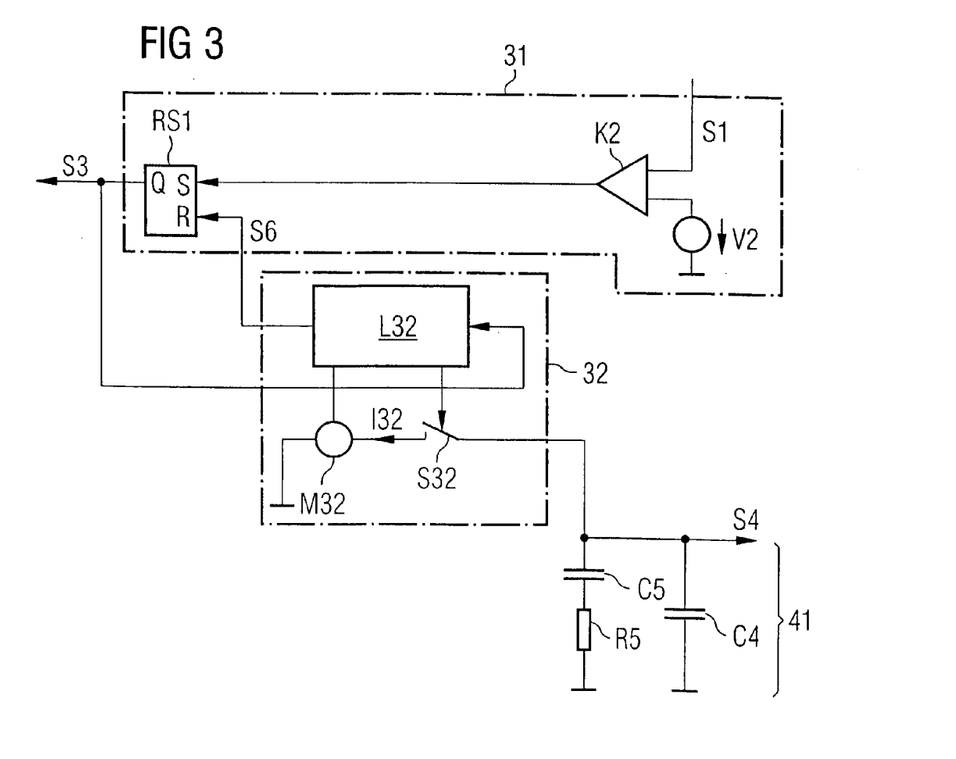
FIG. 3 shows a first exemplary embodiment of a protection circuit for a drive circuit according to the invention.

FIG. 3 shows an exemplary embodiment of a protection circuit 30 with a detection circuit 31 and a discharge circuit 32, the compensation network C4, C5, R5 also being illustrated for reasons of better understanding.

In the exemplary embodiment, the output voltage signal S1 is fed to the detection circuit 31, the detection circuit 31, by means of a comparator K2, comparing the output voltage signal S1 with a reference signal V2 representing a lower limit value and setting an RS flip-flop RS1 if the output voltage signal S1 has decreased below the value of the reference signal V2. The protection signal S3 for inhibiting the switching converter is available at the output of the flip-flop RS1.

In the exemplary embodiment, said protection signal S3 also serves for driving the discharge circuit 32, which, in the example, has a switch S32, which is connected between the compensation network 41 and reference-ground potential and which is driven by a logic circuit L32 in a manner dependent on the protection signal S3. In order to detect a discharge state of the compensation network 41, the discharge circuit 32 has a current measuring arrangement M32 in series with the switch S32, which outputs a current measurement signal to the logic circuit L32. The logic circuit L32 generates a discharge signal S6, which serves for resetting the flip-flop RS1, when a discharge current I32 has decreased below a predetermined value chosen such that, when said discharge current is reached, the compensation network 41 is discharged to an extent such that the control signal S4 present at the latter has decreased to small values. The illustrated current measurement on the basis of the measuring arrangement M32 merely represents an example of the detection of the charge state of the compensation network 41. It goes without saying that it is also possible to use the voltage across the compensation network or the charge stored in the network 41 to detect the state thereof.

Figure 4:
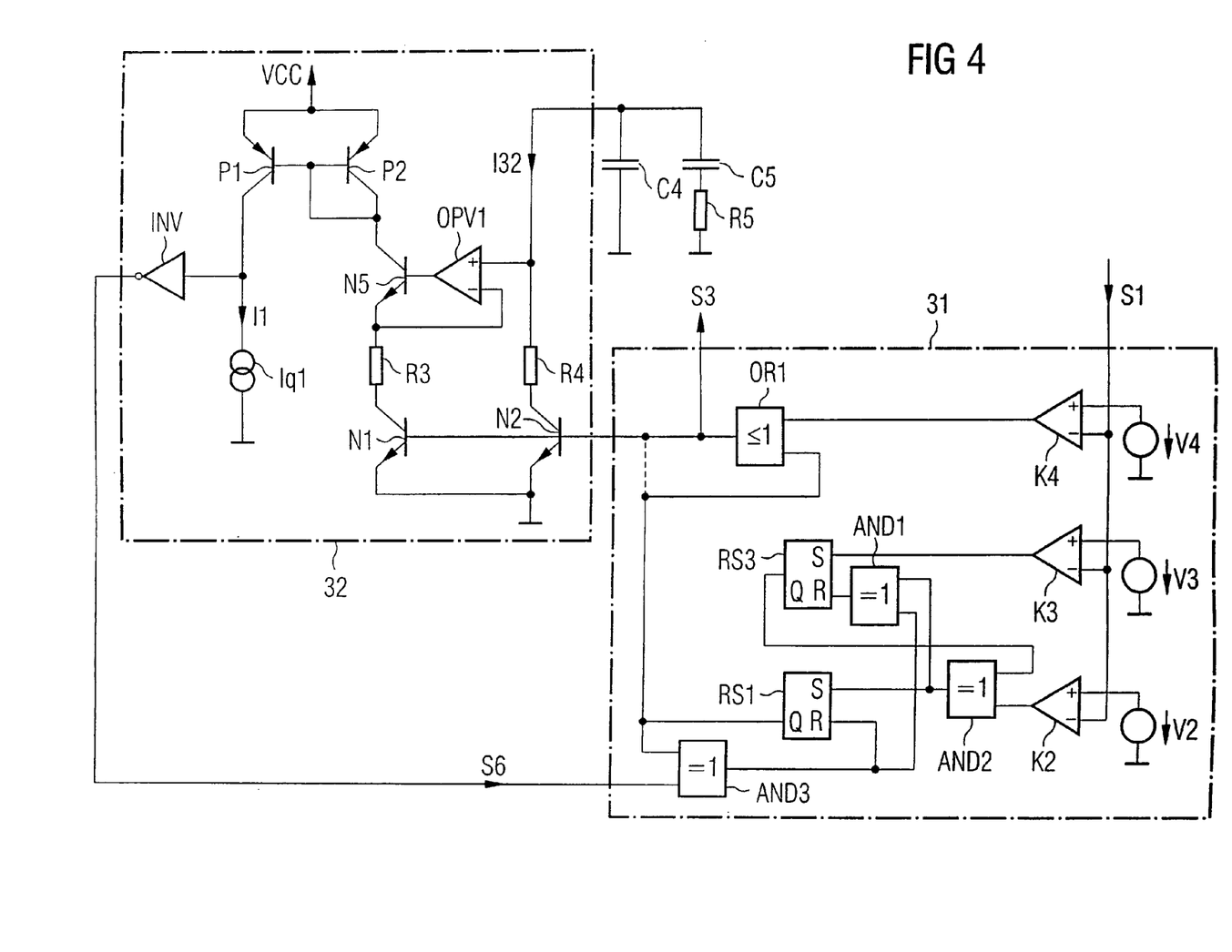
FIG. 4 shows a second exemplary embodiment of a protection circuit for a drive circuit according to the invention.

FIG. 4 shows a further exemplary embodiment of a protection circuit 30 with an example of a circuitry realization of the discharge circuit 32, the compensation network 41 also being illustrated in FIG. 4 for the sake of better understanding. In this example, a switch for discharging the compensation network is designed as a bipolar transistor N2, which is driven by the protection signal S3, the generation of the protection signal S3 also being explained below.

A resistor R4 is connected in series with the bipolar transistor N2. Moreover, a further bipolar transistor N1 is present in series with a further resistor R3, the resistance of which preferably corresponds to the value of the resistor R4, said further bipolar transistor N1 likewise being driven by the protection signal S3. The series circuit having the further bipolar transistor N1 and the resistor R3 is connected to a supply potential VCC via a control transistor N5 and a current mirror circuit P1, P2. The control transistor N5 is driven by an operational amplifier OPV, one of whose inputs is connected to the resistor R4 and whose other input is connected to the resistor R3 and which, given identical dimensioning of the resistors R3, R4 in the circuit branch with the bipolar transistor P2 of the current mirror, the control transistor N5, the resistor R3 and the transistor N1, brings about a current corresponding to the discharge current I32 of the compensation network 41. In a further branch of the current mirror, a reference current source Iq1 is connected in series with a current mirror transistor P1, an inverter INV being connected to a node common to the transistor P1 and the current source Iq1, the discharge signal S6 being present at the output of said inverter. If the discharge current I32 is initially greater than the current supplied by the current source Iq1, then approximately the entire supply voltage VCC is dropped across the current source Iq1, so that the node common to the transistor P1 and the current source Iq is at a high potential. If the discharge current I32 falls below the reference current of the current source Iq1, then approximately the entire supply voltage VCC is dropped across the bipolar transistor P1 and the potential at the common node of the transistor P1 and the current source Iq1 decreases. The circuit illustrated thus serves as a comparator circuit for comparing the discharge current I32 with a reference current supplied by the current source Iq1, the discharge signal S6, via the inverter, assuming a high level if the discharge current I32 is less than the reference current supplied by the current source Iq1.

As in the example in accordance with FIG. 3, the detection circuit 31 comprises a comparator K2 for comparing the output voltage signal S1 with a reference value V2 representing a lower limit for the output voltage signal S1. In contrast to the example in accordance with FIG. 3, in the case of the exemplary embodiment in accordance with FIG. 4, the RS flip-flop RS1 is set via the comparator K2 not directly but via an AND element AND2, the output signal of the RS flip-flop RS1 forming the protection signal S3 via an OR element OR1. The AND element AND2, in conjunction with a further comparator K3 and also a further flip-flop RS3, has the effect that a protection signal S3 is generated in the event of a decrease in the output voltage signal below the lower limit V2 only when the switching converter was previously in a normal operating state in which the output voltage signal S1 was greater than an upper limit value V3. For this purpose, the output voltage signal S1 is compared with the upper limit value V3 by means of the further comparator K3, the flip-flop RS3 being set if the output voltage signal S3 exceeds the upper limit value V3. The output signal of the further flip-flop RS3 is fed to the AND element AND2, it thereby being ensured that, in the event of a decrease in the output voltage S1 below the value of the lower limit value V2, the flip-flop RS3 can be set only when the further flip-flop RS1 has previously been set.

The flip-flop RS1 is reset by the discharge signal S6 via a further AND element AND3, to which the output signal of the flip-flop RS1 is furthermore fed.

The further flip-flop RS3 is likewise reset via a further AND element AND1 by means of the output signal of the AND element AND2 and of the AND element AND3.

The arrangement with the two comparators K2, K3 and also the two flip-flops RS1, RS2 generates a state signal indicating a critical operating state at the output of the flip-flop RS1 only when the output voltage signal S1 has decreased below a lower limit value V2 after it had previously exceeded an upper limit value V3.

In the exemplary embodiment, the detection circuit 31 detects a further critical operating state, which is determined by virtue of the fact that the output voltage signal S1 is less than a lower limit value V4, which is preferably significantly less than the lower limit value V2. By way of example, the limit value V2 amounts to 50% of the desired value for the output voltage, while the limit value V4 serves for detecting an interruption in the feedback path which provides the output voltage signal S1. The limit value V4 is therefore only slightly above reference-ground potential, by way of example. A further state signal is present at the output of a comparator K4, which compares the output voltage signal S1 with the reference signal V4, the OR element OR1 combining the two state signals at the output of the comparator K4 and at the output of the flip-flop RS1 in order to make the protection signal S3 available therefrom.

By means of the signal S3, in the exemplary embodiment, the compensation network 41 is discharged both in the event of detection of the first critical operating state by the arrangement with the two comparators K2, K3 and the flip-flops RS1, RS3 and in the event of detection of the second critical operating state by the comparator K4 and the switching converter is switched off by means of the protection signal S3.

Figure 5:
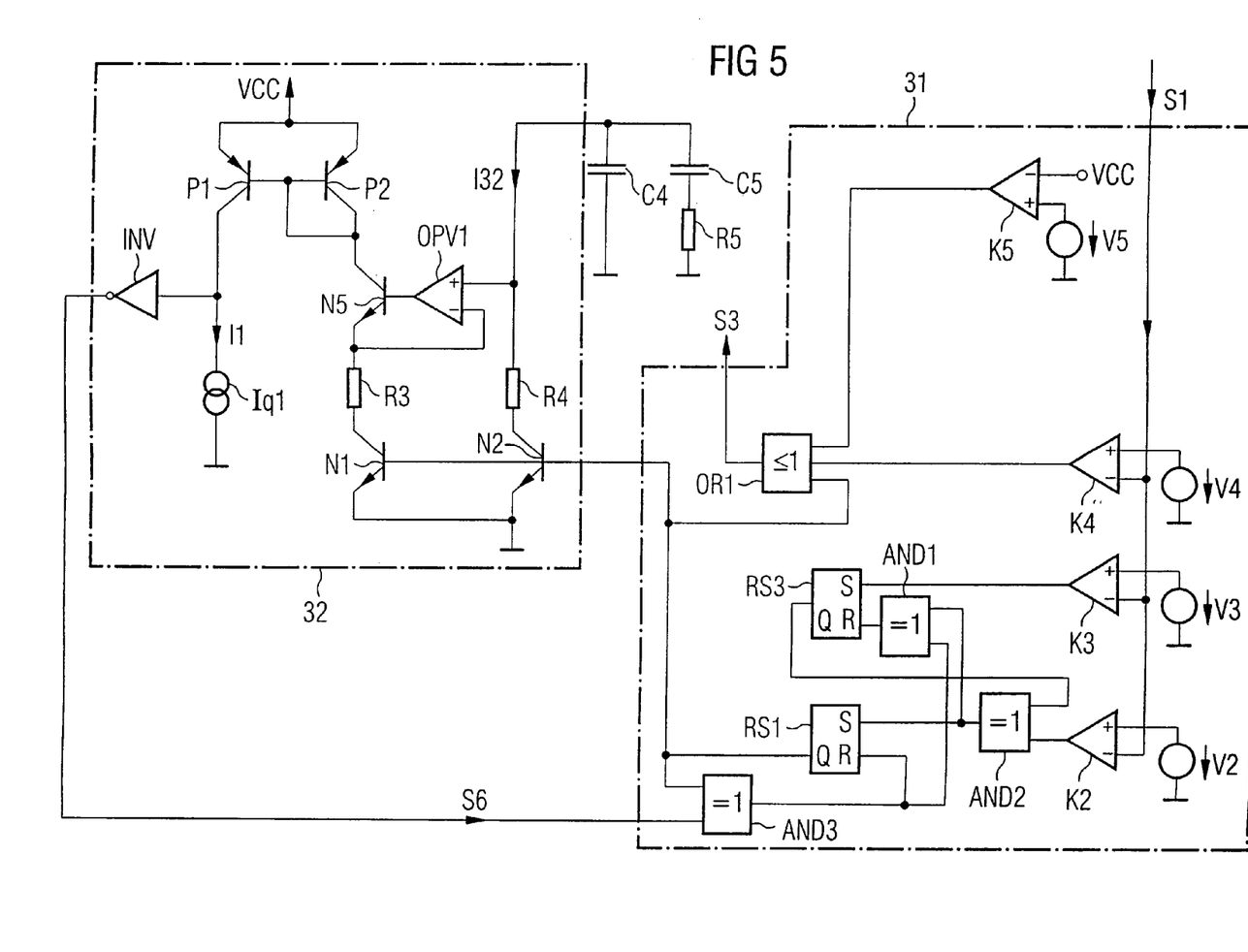
FIG. 5 shows a third exemplary embodiment of a protection circuit for a drive circuit according to the invention.

FIG. 5 shows a further exemplary embodiment of a protection circuit, in which the discharge circuit 32 is driven only on detection of the first critical operating state, in order to discharge the compensation network 41, while upon detection of the second critical operating state, although a protection signal is generated, for switching off the switching converter, the discharge circuit is not driven.

In the case of the protection circuit illustrated in FIG. 5, a third critical operating state is detected by the supply potential VCC of the drive circuit being compared with a reference value V5 by a further comparator K5, a critical operating state being present when the supply potential VCC is less than the reference value V5, and the switching converter then being switched off by means of the protection signal S3. Upon detection of this third critical operating state, the discharge circuit 32 is not driven in the exemplary embodiment. In the example, the discharge circuit 32 is only driven by the output signal of the RS flip-flop RS1 in a manner dependent on a detection of the first critical operating state.

Even though the drive circuit according to the invention and also the method for driving the switch in a switching converter have been illustrated on the basis of a PFC, it should be pointed out that the drive circuit and the drive method can be applied to any desired switching converters in which a controller arrangement having a control amplifier and a compensation network is present.

LIST OF REFERENCE SYMBOLS

| | |
|---|---|
| K10, K11 | Input terminals |
| K20, K21 | Output terminals |
| Vin | Input voltage |
| Vout | Output voltage |
| L | Coil |
| T | Switch, MOSFET |
| D | Diode |
| C | Capacitor |
| I | Input current |
| Vin' | Rectified input voltage |
| Vcc | Supply potential |
| 100 | Drive circuit |
| K1, K2, K3 | Connecting terminals |
| 20 | Drive signal, generating circuit |
| 21 | Pulse width modulator |
| 22 | AND element |
| 23 | Driver circuit |
| S7 | Pulse-width-modulated signal |
| S3 | Protection signal |
| S4 | Output-voltage-dependent control signal |
| S2 | Input current signal |
| S1 | Output voltage signal |
| R10, R20 | Voltage divider |
| V1 | Reference signal |
| OTA1 | Control amplifier |
| 40 | Control arrangement |
| 41 | Compensation network |
| C4, C5 | Capacitors |
| R5 | Resistor |
| 30 | Protection circuit |
| 31 | Detection circuit |
| 32 | Discharge circuit |
| S6 | Discharge signal |
| RS1, RS3 | RS flip-flops |
| AND1, AND2, AND3 | AND elements |
| OR1 | OR elements |
| K2, K3, K4 | Comparators |
| V3, V4 | Reference signals |
| P1, P2 | pnp bipolar transistors |
| N1, N2, N5 | npn bipolar transistors |
| OPV | Operational amplifier |
| I32 | Discharge current |
| Iq1 | Current source |
| INV | Inverter |
| L32 | Drive logic |
| S32 | Switch |
| M32 | Current measuring arrangement |

The invention claimed is:

1. A drive circuit for a switch of a switching converter which generates an output voltage from an input voltage, the drive circuit comprising:
   a first input terminal configured to receive an output voltage signal, the output voltage signal representative of the output voltage of the switching converter,
   a controller arrangement having at least one control amplifier and at least one energy storage element coupled to the at least one control amplifier, the controller arrangement operable to receive the output voltage signal and generate a control signal based at least in part on the output voltage signal,
   a protection circuit operable to detect at least one critical state of the switching converter, the protection circuit further operable to generate a protection signal dependent on the detection of at least one critical state, the protection circuit further comprising a discharge circuit coupled to the at least one storage element,
   a signal generating circuit operably coupled to receive the control signal and the protection signal, the signal generating circuit operable to generate a drive signal based at least in part on the control signal, the signal generating circuit operable to provide the drive signal as an output dependent on the protection signal.

2. The drive circuit as claimed in claim 1, wherein the at least one energy storage element is coupled to an output of at least one control amplifier.

3. The drive circuit as claimed in claim 1, wherein the at least one energy storage element includes a capacitor.

4. The drive circuit as claimed in claim 1, wherein the discharge circuit is configured to discharge the at least one energy storage element upon the detection of at least one critical state.

5. The drive circuit as claimed in claim 1, wherein the discharge circuit includes a switch connected between the at least one energy storage element and a reference-ground potential, the switch selectively closed responsive to detection of at least one critical state by the control circuit.

6. The drive circuit as claimed in claim 1, wherein the discharge circuit is operably connected to detect a discharge state of the at least one energy storage element, the discharge circuit further operable to generate a discharge signal dependent at least in part on the discharge state.

7. The drive circuit as claimed in claim 6, wherein the discharge circuit includes a current measuring circuit operable to detect the discharge state by detecting a discharge current of the at least one energy storage element, the current measuring circuit further operable to generate the discharge signal in a manner dependent on an amplitude of the discharge current.

8. The drive circuit as claimed in claim 7, wherein the discharge circuit is configured to generate the discharge signal in a manner dependent on a comparison of the discharge current to a reference current.

9. The drive circuit as claimed in claim 6, wherein the protection circuit generates the protection signal in a manner dependent on the discharge signal.

10. The drive circuit as claimed in claim 1, wherein the protection circuit is further operable to receive the output voltage signal, and the protection circuit is further operable to detect a first critical state if the output voltage signal is less than a first threshold value.

11. The drive circuit as claimed in claim 10, wherein the protection circuit is further operable to:
    detect if the output voltage signal exceeds a second threshold, the second threshold value greater than the first threshold value; and
    after detection that the output voltage signal exceeds the second threshold, detect the first critical state if the output voltage signal falls below the first threshold value.

12. The drive circuit as claimed in claim 10, wherein the protection circuit is further operable to detect a second critical state if the output voltage signal falls below a second threshold, the second threshold being less than the first threshold.

13. The drive circuit as claimed in claim 1, further comprising a connecting terminal configured to receive a supply potential, the protection circuit operably coupled to the connecting terminal, and wherein the protection circuit is operable to detecting a first critical state if the supply potential falls below a predetermined threshold value.

14. The drive circuit as claimed in claim 1, further comprising an input terminal for receiving an input current signal, the input current signal corresponding to an input current of the switching converter, and wherein the signal generating circuit is further operable to generate the drive signal based at least in part on the control signal and at least in part on the input current signal.

15. The drive circuit as claimed in claim 1, the signal generating circuit is operable to inhibit output of a drive signal if the protection signal has a predetermined level.

16. A switching converter comprising:
- an input rectifier configured to receive and AC input signal;
- a coil connected to the input rectifier;
- a switch connected between the coil and a reference potential, the switch having a control input;
- an output operable to generate an output voltage of the switching converter;
- a rectifier device connected between the switch and the output;
- a drive circuit operably coupled to provide a drive signal to the control input of the switch, the driver circuit comprising,
    - a first input terminal configured to receive an output voltage signal, the output voltage signal representative of the output voltage,
    - a controller arrangement having at least one control amplifier and at least one energy storage element coupled to the at least one control amplifier, the controller arrangement operable to receive the output voltage signal and generate a control signal based at least in part on the output voltage signal,
    - a protection circuit operable to detect at least one critical state of the switching converter, the protection circuit further operable to generate a protection signal dependent on the detection of at least one critical state, the protection circuit further comprising a discharge circuit coupled to the at least one storage element,
    - a signal generating circuit operably coupled to receive the control signal and the protection signal, the signal generating circuit operable to generate the drive signal based at least in part on the control signal, the signal generating circuit operable to provide the drive signal as an output dependent on the protection signal.

17. A method for driving a switch connected to a rectifier arrangement in a switching converter which provides an output voltage from an input voltage, the method comprising the following method steps:
   a) providing an output voltage signal that corresponds to an output voltage of the switching converter;
   b) generating a control signal based on the output voltage signal using a circuit that includes at least one energy storage device, and generating drive pulses based at least in part on the control signal;
   c) monitoring for at least one critical state of the switching converter based on the output voltage signal;
   d) interrupting the generation of drive pulses if a critical state is detected; and
   e) at least partially discharging the at least one energy storage device upon interrupting the generation of drive pulses.

18. The method as claimed in claim 17, wherein step e) further comprises:
   f) detecting a discharge current; and
   g) discharging the at least one energy storage until the discharge current falls below a predetermined threshold.

19. The method as claimed in claim 17, wherein step c) further comprises detecting a first critical state if the output voltage signal is less than a first threshold value.

20. The method as claimed in claim 19, wherein step c) further comprises detecting a second critical state if the output voltage signal falls below a second threshold, the second threshold less than the first threshold.

21. The method as claimed in claim 17, further comprising:
   detecting a critical state if a supply potential falls below a predetermined threshold.

* * * * *